United States Patent [19]

Nelson

[11] 4,292,517
[45] Sep. 29, 1981

[54] PHOTO-OPTICAL KEYBOARD PROVIDING TACTILE FEEL

[75] Inventor: Edward I. Nelson, Sunrise, Fla.

[73] Assignee: Burroughs Corporation, Detroit, Mich.

[21] Appl. No.: 75,395

[22] Filed: Sep. 14, 1979

[51] Int. Cl.³ .............................................. G01D 5/34
[52] U.S. Cl. .................................. 250/229; 400/491.3
[58] Field of Search .............................. 250/221, 229; 235/145 R; 340/365 P, 365 R, 365 C, 365 L; 178/17 C, 17 D; 400/479, 491.3

[56] References Cited

U.S. PATENT DOCUMENTS 3,822,776  7/1974  Pratt .................................. 400/491.3
3,882,295  5/1975  Madland ............................ 400/479
4,013,342  3/1977  Narodny ............................ 250/229

Primary Examiner—David C. Nelms
Attorney, Agent, or Firm—David G. Rasmussen; Kevin R. Peterson; Edmund M. Chung

[57] ABSTRACT

The invention relates to a photo-optical keyboard having an improved keyboard housing and keys to provide a tactile feel to the keyboard. The keyboard housing is a molded plastic piece having a matrix of rows and columns of apertures for keys. Each of the apertures has ridges on the interior surface. The keys are each shaped to the apertures. Each key further has flexible fingers on its sidewalls. The flexible fingers have ridges thereon. The ridges on the flexible fingers make contact with the ridges on the inside surface of the aperture during the key depression to provide a tactile feel.

5 Claims, 10 Drawing Figures

PHOTO-OPTICAL KEYBOARD PROVIDING TACTILE FEEL

BACKGROUND OF THE INVENTION

1. Field of the Invention

The invention relates to a photo-optical keyboard. More specifically, the invention relates to an improved keyboard housing and keys for providing a tactile feel to the keys.

2. Description of the Prior Art

A tactile feel is a requirement for many applications of keyboards. Previously, tactile feel for the keys of a keyboard has been provided by keys having a number of mechanical parts. Examples of such types of keys with tactile feel are disclosed in U.S. Pat. Nos. 3,860,771, 4,032,729, 3,822,776, 3,882,295 and 3,964,593. These keys are all expensive to manufacture and are subject to wear and breakage because of the mechanical parts. It would be desirable to have a key providing tactile feel which is simple in structure, inexpensive, and durable.

SUMMARY OF THE INVENTION

The present invention provides a keyboard housing and keys which overcome the problems of the prior art. The invention is a molded keyboard housing having a matrix of rows and columns of apertures for keys. Each of the apertures has a ridge on its inside surface. The keys are shaped to the apertures. Each of the keys further has flexible fingers in its sidewalls. The flexible fingers have ridges thereon which are located to match the ridges in the apertures. The ridges on the flexible fingers make contact with the ridges on the inside surface of the apertures during a key depression to provide a tactile feel.

One novel feature of the invention is the ridges within the key apertures of the keyboard housing. This allows the keyboard to be molded as one plastic piece thereby reducing cost.

A second novel feature is the use of flexible fingers having ridges thereon in the sidewalls of the key. The flexible fingers allow the ridges on the interior of the apertures and on the flexible fingers to come in contact and pass with a minimum of wear but still provide a tactile feel. In addition, the key can be molded from plastic in one operation.

The subject matter of this application is related to the subject matter of co-pending U.S. patent applications entitled "Molded Plastic Photo-Optical Keyboard", by Edward Nelson, and "Photo-Optical Keyboard Having N Key Rollover", by Edward Nelson, John Lane, Harry Mueller, filed concurrently with the present application and assigned to the same assignee as the present invention.

DETAILED DESCRIPTION OF THE PREFERRED EMBODIMENT(S)

Figure 1:
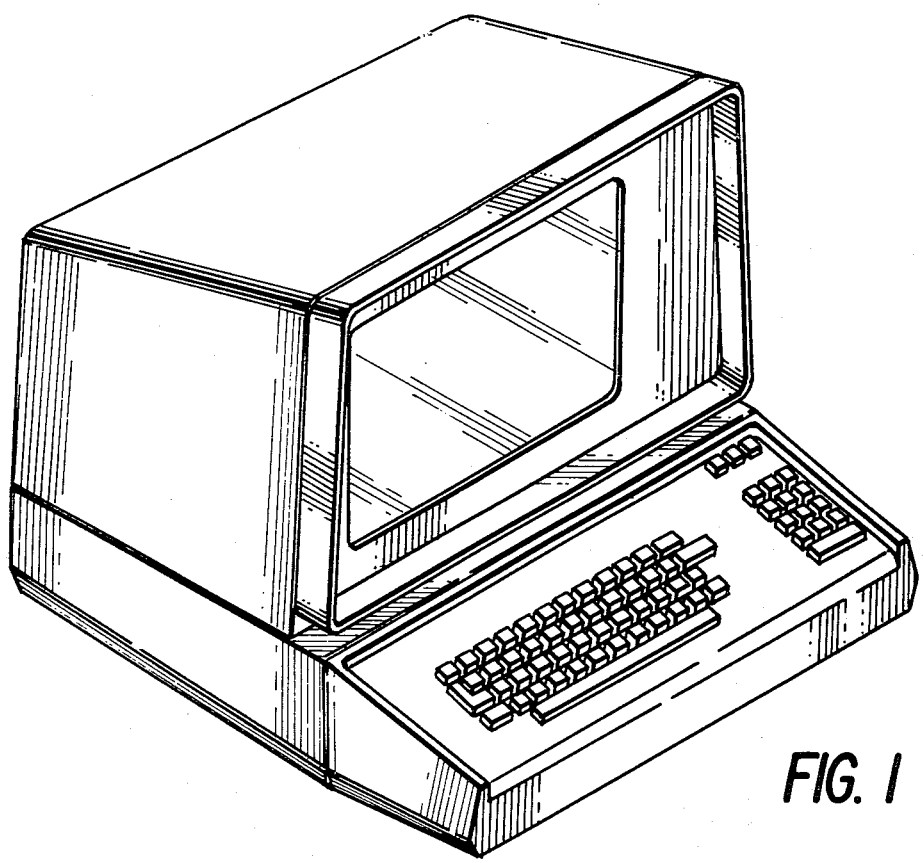
FIG. 1 is a perspective view of a CRT display terminal having a photo-optical keyboard.

FIG. 1 shows a typical operator terminal for a computer, word processor, or like type system. The terminal may, for example, have the characteristics of a typewriter and a calculator. The keys may be in a rectangular matrix as the calculator keys or in a staggered or offset matrix as the typewriter keys. All of the keys are located on one keyboard which has an excess capacity of key locations and is easily expandable. To add other keys to the keyboard, the only change that need be made is the insertion of the keys and changing of the faceplate.

Figure 2:
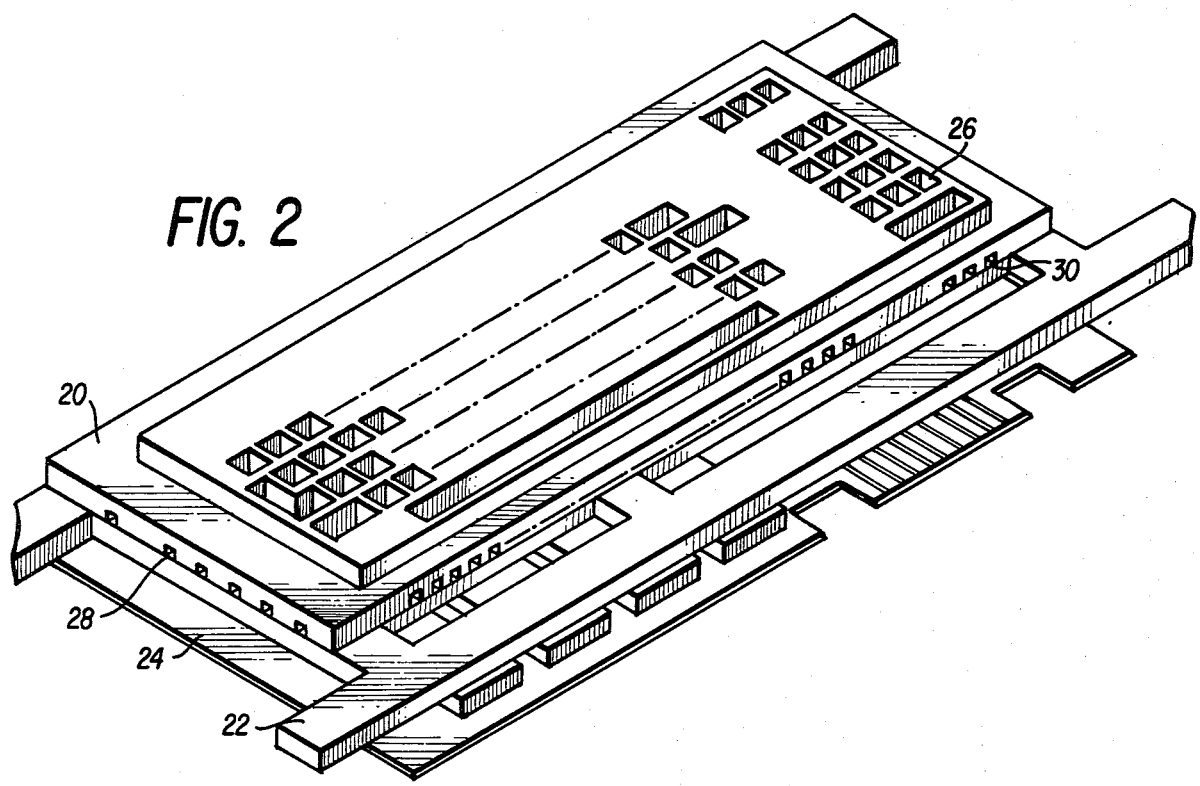
FIG. 2 is a perspective view of the photo-optical keyboard assembly of FIG. 1 having keys, faceplate, and CRT removed.

FIG. 2 shows the keyboard of FIG. 1 with the faceplate and keys removed. The keyboard consists of a keyboard housing 20, a baseplate 22, and a printed circuit board 24. Printed circuit board 24 is attached to baseplate 22 by appropriate spacers (not shown). Keyboard 20 has rectangular apertures into which keys will fit. Only a few apertures are shown for illustration purposes. However, normally the whole raised portion of keyboard housing 20 is taken up with apertures. At the base of keyboard housing 20 are shown optical passages or light channels. Light channels 28 extend along one axis and light channels 30 extend along the other axis. Light channels 28, 30 are entirely in the bottom surface of keyboard housing 20. Light channels 28 extend through all of the apertures in each row. Light channels 30 extend through all of the apertures in each column. An illumination source such as a light, LED, or fiber optic bundle is placed at one end of light channels 28, 30 and photo-receptors are placed at the other end. These are not shown.

Printed circuit board 24 contains all of the decoding and electronic circuitry necessary for the keyboard. This all may be done with conventional circuitry.

Figure 3:
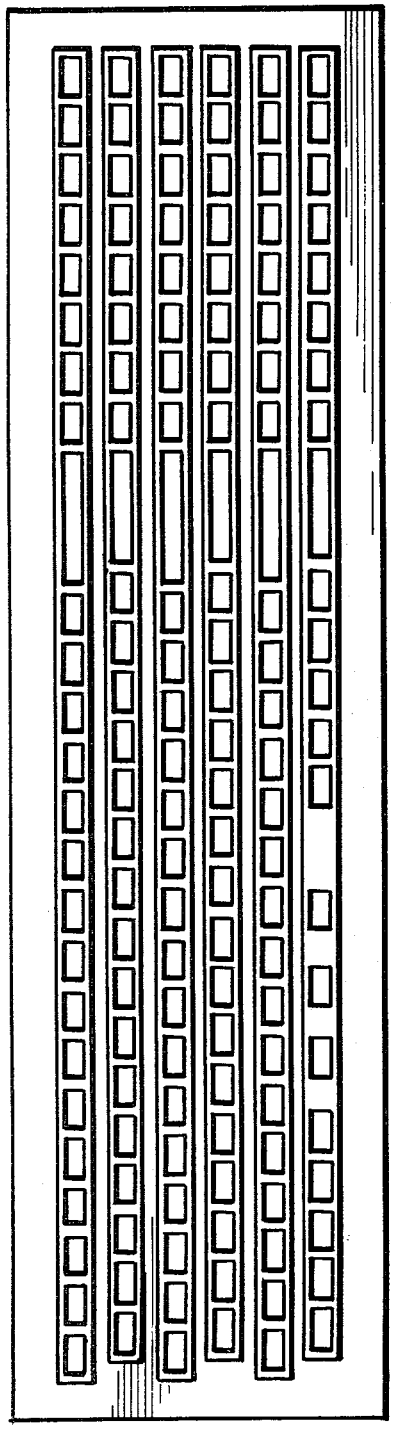
FIG. 3 is a plan view of a keyboard housing having key apertures in a rectangular matrix and a diagonal matrix.

FIG. 3 shows a more detailed top view of the key aperture arrangement on the keyboard housing 20 of FIG. 2. The leftmost group of keys are in a staggered or offset matrix typical of a typewriter keyboard. The group of keys on the right are in a rectangular matrix typical of calculator keys.

Figure 4:
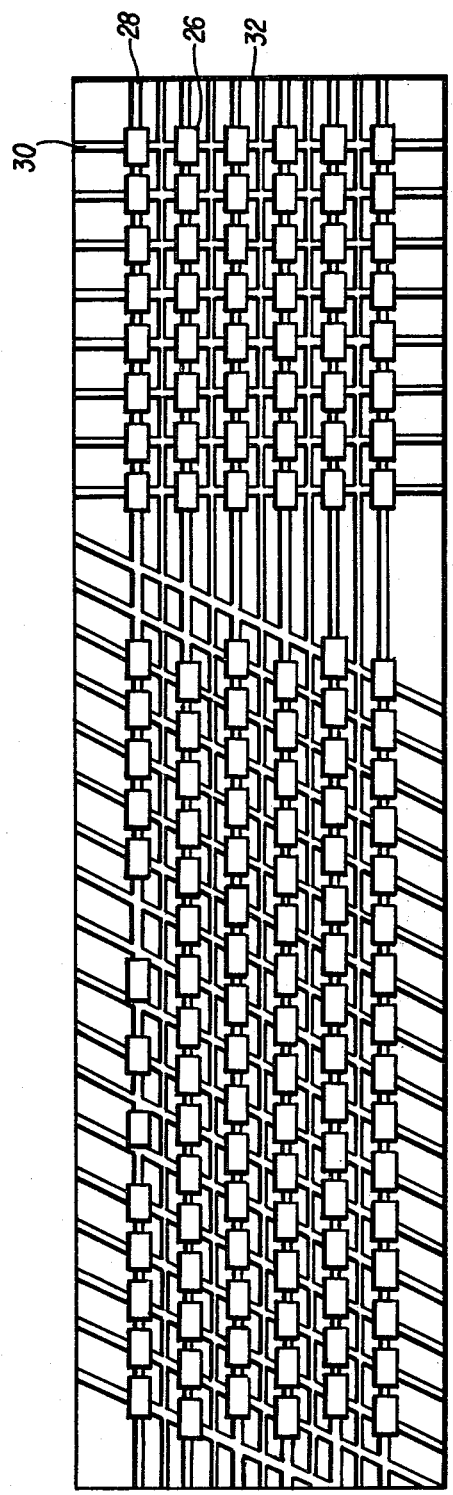
FIG. 4 is a bottom view of the keyboard housing of FIG. 3 showing light channels for both the diagonal matrix and the rectangular matrix.

FIG. 4 shows a bottom view of the keyboard housing of FIG. 2. The bottoms of the apertures 26 in both the offset and the rectangular matrixes have light channels 28, 30 for the rows and columns respectively. Between each of the rows are light isolation barrier channels 32 which are molded into the bottom of the keyboard housing.

Figure 5:
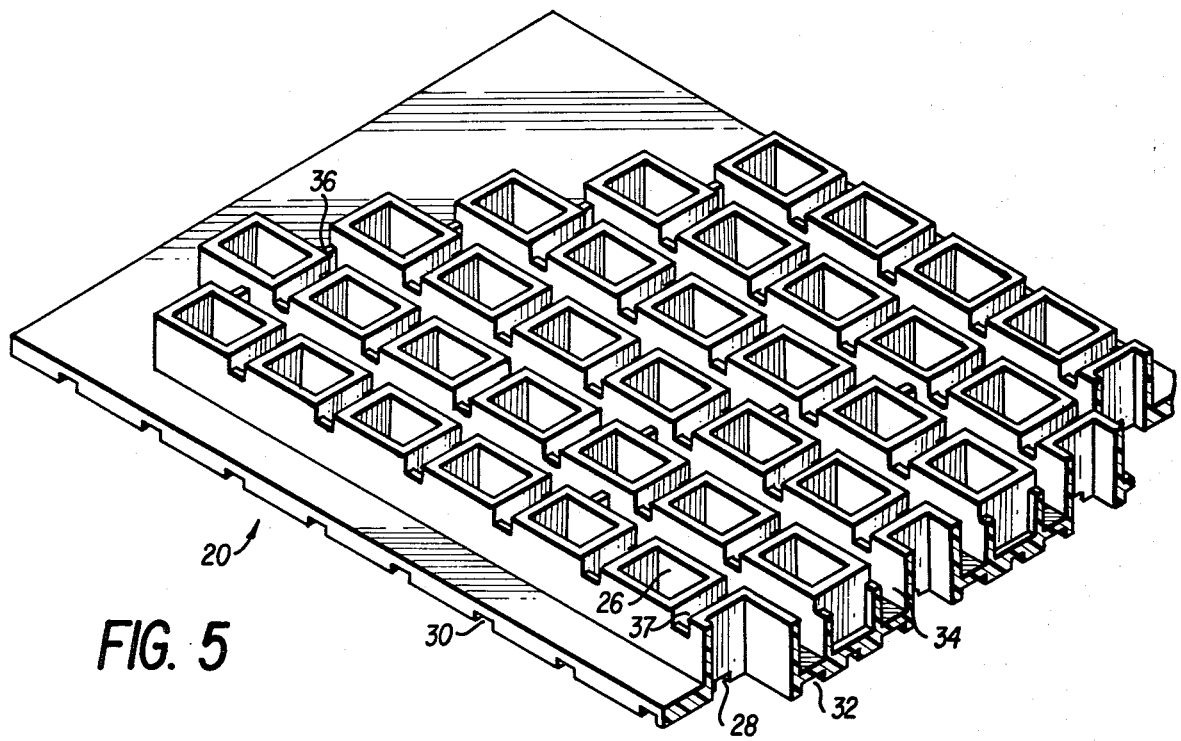
FIG. 5 is a perspective partial sectional view of the diagonal matrix portion of the keyboard housing in FIG. 4.

FIG. 5 shows a sectional view of the keyboard housing 20. Light channels 28 and 30 are at the bottom the keyboard housing. These channels may be of the order of 3/32 inch in depth. Likewise, light isolation barrier channels 32 between the rows are at the bottom of the keyboard housing. Between the rows of apertures are recesses 34 and structural supports 36. The structural supports are below the top surface of the keyboard housing. Between columns of apertures 26 are recesses 37. The sidewalls of recesses 37 are lower than the sidewalls of apertures 26. Recesses 34, 37 are to catch accidental liquid spills on the keyboard.

Figure 6:
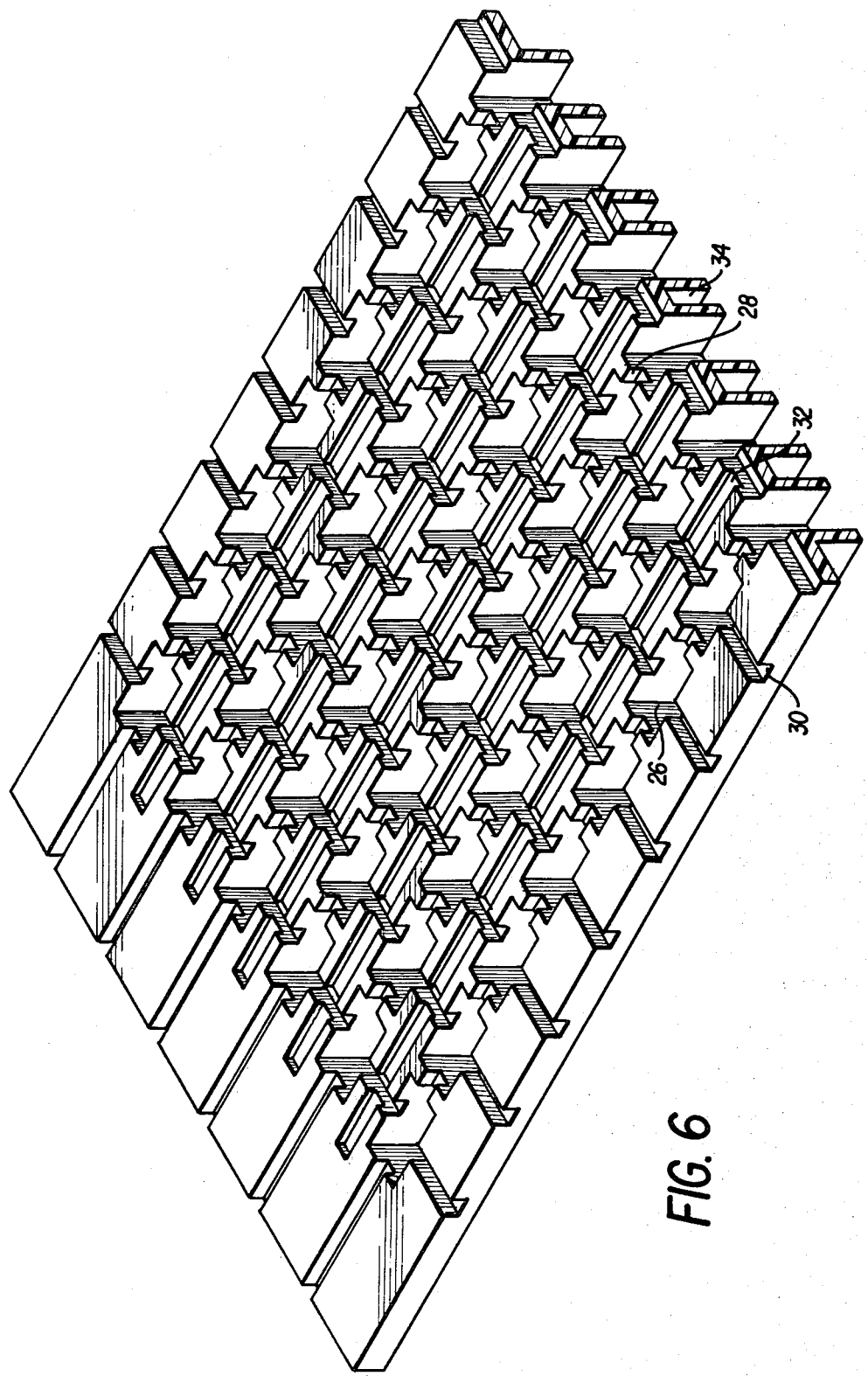
FIG. 6 is a perspective partial sectional view of the bottom of the rectangular matrix portion of the keyboard housing of FIG. 4.

FIG. 6 shows a sectional bottom view of the keyboard housing. Light channels 28 and 30 are open to the bottom of the keyboard housing. Likewise light isolation channels 32 are also open to the bottom of the keyboard housing. Recesses 34 may also be seen.

The light channels, light isolation barrier channels, and aperture orientation allow the keyboard housing to be molded from plastic in a single molding operation.

Figure 7:
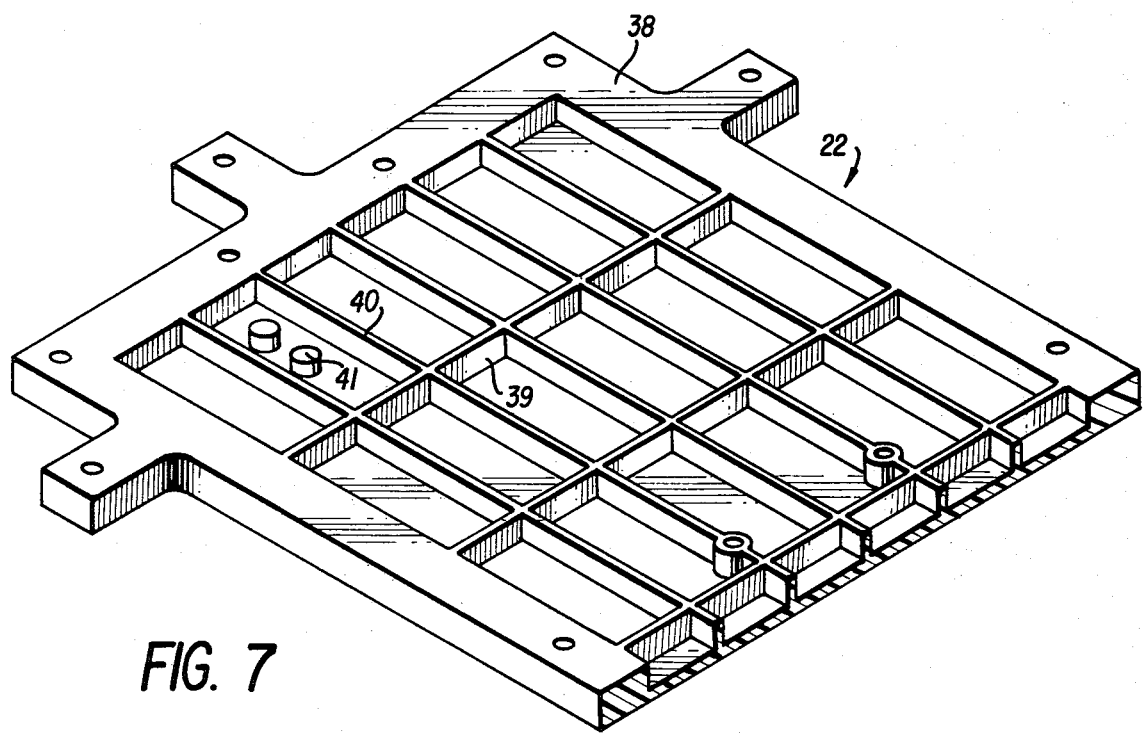
FIG. 7 is a perspective partial sectional view of the baseplate of the keyboard assembly of FIG. 2.

FIG. 7 shows baseplate 22 of the keyboard. The outer edge 38 will fit flush to the bottom of keyboard housing 20. The inner portion of base plate 22 is recessed with light isolation barrier 40 (i.e. ribs) running in the direction of the rows. Structural supports 39 run in the direction of the columns. The light isolation barriers 40 are intended to fit up into light isolation channels 32 (shown in FIG. 6) The light isolation barriers are rerequired to prevent divergent light from one row from impinging on a photoreceptor for another row. The rows are long, of the order of 20 inches, and light divergence is large, therefore, the light isolation barriers are needed. On the other hand, the columns are short, of the order of 4 inches, and divergence is smaller so the barriers are not needed. The ribs have been positioned at intervals of every two or three columns only for strength. Projections 41 are spring retainers which are placed at a location below each aperture 26 of the keyboard (only two are shown). The structure of baseplate 22 may be molded plastic in a one-piece molding operation.

Figure 8:
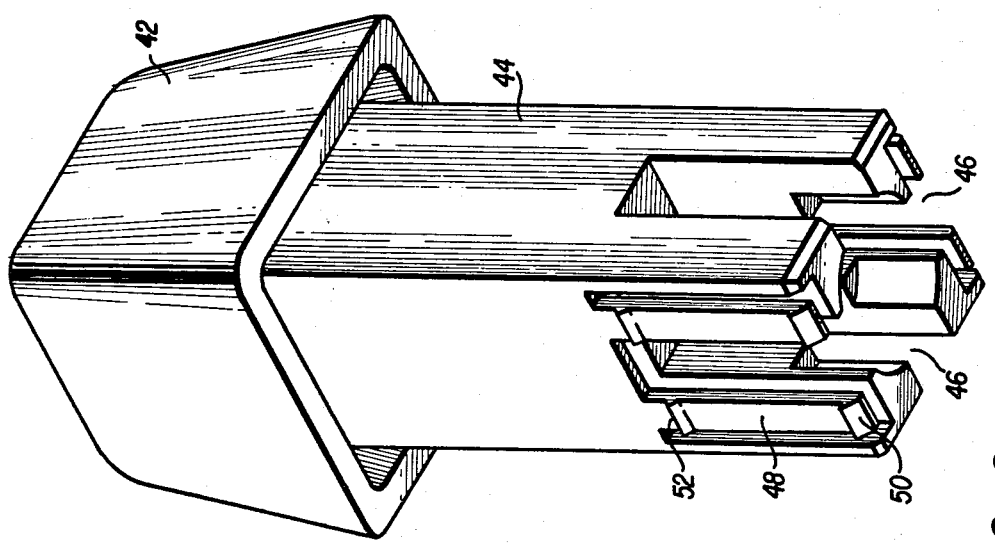
FIG. 8 is a perspective view of a key used in the keyboard assembly of FIG. 2.

FIG. 8 shows a key for use in keyboard housing 20. The key has an umbrella shaped head 42 and a large rectangular keystem 44. The key has vertical slots 46 in each of the four sidewalls which open up to the bottom of the key. The inner portion of the key is cut away to allow the key to fit over spring retainer 41 of base plate 22. At two of the edges of the key are flexible fingers 48. At the bottoms of these flexible fingers are flanges 50. Also on each flexible finger is a small ridge 52. The way in which light slots 46 are constructed, being open at the bottom, makes the key well suited for being molded in one piece. The key is made of a high wear material such as acetel plastic. An example is Delrin manufactured under trademark by DuPont.

Figure 9:
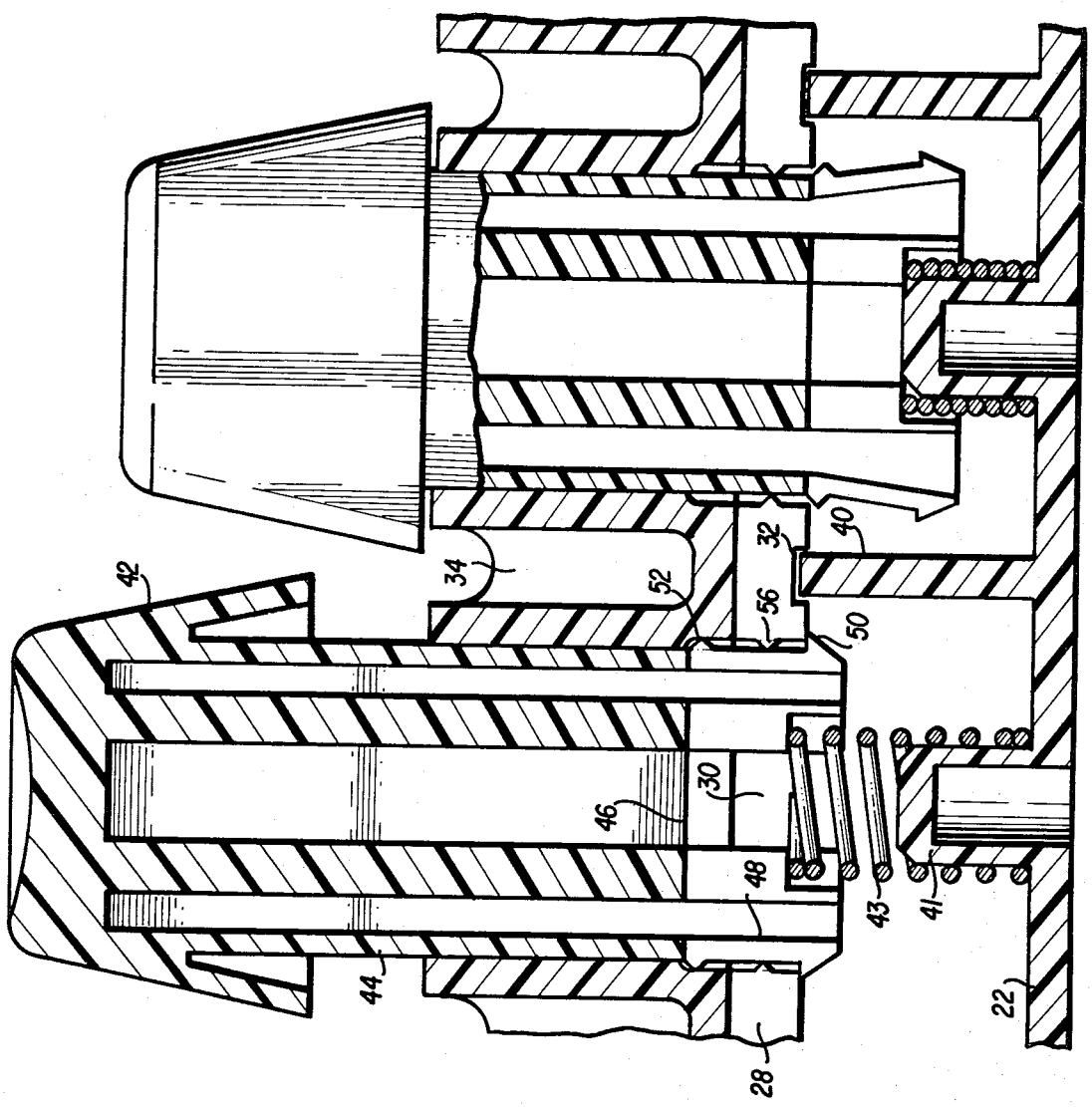
FIG. 9 is a sectional view of the keys shown in FIG. 8.

FIG. 9 shows a sectional view of the key of FIG. 8 in place in keyboard housing 20. Keyhead 42 extends over recess 34. This allows any liquid spills on the keyboard to be trapped in recess 34 rather than draining into the keyboard. Keystem 44 extends through aperture 26. The inner surface of aperture 26 has ridges 56. These ridges are meant to contact ridges 52 on flexible fingers 48 of the key to provide a tactile feel to the key when it is depressed. The flexible fingers allow the ridges to pass after contact is made. The exact pressure needed for the tactile feel may be predetermined by changing the slope and the amount of interference (height) of ridges 52, 56. At the end of flexible fingers 48 are flanges 50 which serve as stops to prevent the key from leaving the keyboard. The flexibility of finger 48 allows the key to be withdrawn easily for replacement. Upon withdrawal the flexible finger flexes inwardly to allow the key to come out.

Light channel 28 is shown extending from left to right across FIG. 9. Light channel 30 comes out of the drawing and is in the same plane as light channel 28. Slot 46 is molded so that a portion of the opening is above the level of light channel 30. This allows for a small amount of free travel of the key, about 3/32 of an inch, before a key depression is registered. The remaining 3/32 travel of the key is for actuation of the key. An operator may keep a finger on the keys with a slight pressure even when not intending to depress the key.

Spring retainer 41 is a raised projection from baseplate 22. The spring retainer prevents slippage of spring 43. Umbrella cap 42 contacts keyboard housing 20 and prevents keystem 44 from being depressed all the way to the bottom of baseplate 22. This is shown in the figure at the right. Light isolation barriers 40 extend up into light isolation barrier channels 32.

In operation the photo-optical keyboard generally operates the same as prior art photo-optical keyboards. The principles are the same and the circuitry and decoding logic may be of a conventional type. What differs about the present invention is the simplification of the keyboard housing and the keys to provide a tactile feel at reduced cost and improved durability.

One advance in the present keyboard is incorporating the tactile feel ridges in the apertures of keyboard housing 20 rather than the conventional method of adding additional elements at assembly. This allows the keyboard housing to be molded from plastic as a single piece, which reduces cost and simplifies the assembly process.

A second advance in the present keyboard is the use of a plastic key having flexible fingers and ridges on the flexible fingers. The flexible fingers allow the ridges on the fingers and the ridges on the inner surface of the apertures to meet and pass easily with a minimum of wear. The structure of the flexible fingers and of the ridges allows the key to be molded in a one-piece operation thereby reducing cost.

Figure 10:
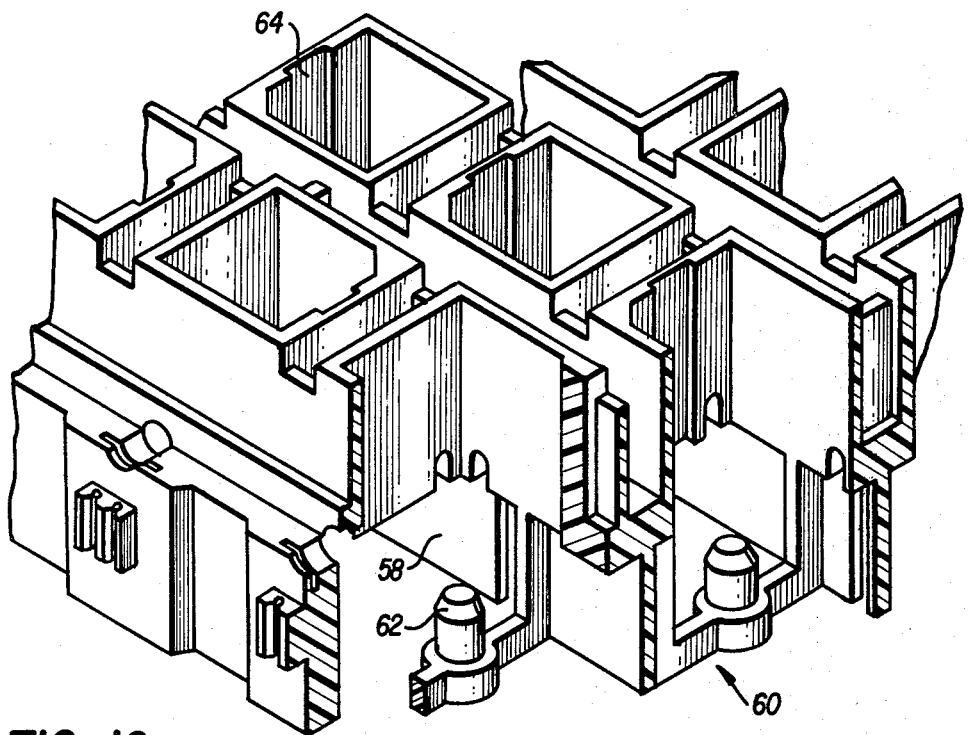
FIG. 10 is a perspective partial sectional view of an alternative keyboard housing.

An alternative embodiment of the apparatus shown in FIGS. 1-9 is shown in FIG. 10. This embodiment is simpler in structure and is preferred under some circumstances. In this embodiment light isolation barriers 58 extend downward from keyboard housing 60. This is in contrast to the previous embodiment where the light isolation barrier 40 extends up from the baseplate 22 (shown in FIG. 7). By molding the light isolation barriers 58 as part of the keyboard housing 60 the need for a baseplate is eliminated. The spring retainers 41 of baseplate 22 (FIG. 7) are replaced by spring retainers 62 which are supported between the light isolation barriers 58. Tactile ridge channels 64 for the inclusion of tactile ridges have been added. Tactile ridges are in each channel near the bottoms of the key apertures.

What is claimed is:
1. A photo-optical keyboard comprising:
a keyboard housing having a matrix of rows and columns of apertures for keys, each said aperture having at least one ridges on the inside surface of said apertures; and
multiple keys each shaped to said apertures, each said key further having at least one flexible finger on its side walls said flexible finger having ridges thereon, the ridges on said flexible finger making contact with the ridges on the inside surface of said apertures during key depression to provide tactile feel.

2. The apparatus of claim 1 in which said apertures for keys have at least one recessed tactile ridge channel in said sidewalls in which said ridges of said apertures are located, said flexible fingers with ridges riding in said channels to provide a tactile feel.

3. The apparatus of claim 1 in which said ridges are sloping, the amount of slope being predetermined to provide the required tactile pressure.

4. A photo-optical keyboard comprising:
   a keyboard housing having a matrix of ows and columns of apertures for keys, each said aperture having at least one ridges on the inside surface of said apertures, the underside surface of said housing having a light channel for each row passing through the apertures for each row, a light channel for each column, each said light channel opening up at the underside surface of said keyboard housing; and
   multiple keys each shaped to said apertures, each key having ridges thereon, said keys having passages to allow light from said light channels to pass in the undepressed position, said key causing an interruption of light in said light channels in the depressed position, the ridges on said flexible fingers making contact with the ridges on the inside surface of said aperture during key depression to provide a tactile feel.

5. The apparatus of claim 3 having light isolation barriers extending downward from the underside of said keyboard housing to prevent crossover of light.

* * * * *